United States Patent
Pancholi et al.

(10) Patent No.: US 8,085,099 B2
(45) Date of Patent: Dec. 27, 2011

(54) SELF-CALIBRATING RELAXATION OSCILLATOR BASED CLOCK SOURCE

(75) Inventors: Deepak Pancholi, Bangalore (IN); Bhavin Odedara, Bangalore (IN); Naidu Prasad, Bangalore (IN); Srikanth Bojja, Bangalore (IN); Srinivasa Rao Sabbineni, Bangalore (IN); Jayaprakash Naradasi, Bangalore (IN)

(73) Assignee: SanDisk Technologies Inc., Plano, TX (US)

( * ) Notice: Subject to any disclaimer, the term of this patent is extended or adjusted under 35 U.S.C. 154(b) by 130 days.

(21) Appl. No.: 12/754,836

(22) Filed: Apr. 6, 2010

(65) Prior Publication Data

US 2011/0241784 A1     Oct. 6, 2011

(51) Int. Cl.
*H03L 7/085*     (2006.01)
*H03K 3/02*     (2006.01)

(52) U.S. Cl. .............. 331/17; 331/14; 331/143

(58) Field of Classification Search .......... 331/111, 331/143, 17, 1 A, 16, 34, 44, 14
See application file for complete search history.

(56) References Cited

U.S. PATENT DOCUMENTS

| | | | |
|---|---|---|---|
| 5,687,202 A * | 11/1997 | Eitrheim | 375/376 |
| 5,699,024 A | 12/1997 | Manlove | |
| 5,887,154 A | 3/1999 | Iwasa et al. | |
| 6,040,622 A | 3/2000 | Wallace | |
| 6,114,920 A | 9/2000 | Moon et al. | |
| 6,279,114 B1 | 8/2001 | Toombs et al. | |
| 6,727,768 B1 * | 4/2004 | Dasgupta | 331/143 |
| 6,798,299 B1 | 9/2004 | Mar et al. | |
| 6,820,148 B1 | 11/2004 | Cedar et al. | |
| 6,901,457 B1 | 5/2005 | Toombs et al. | |
| 7,090,124 B2 | 8/2006 | Wallace et al. | |
| 7,154,342 B2 | 12/2006 | Munker et al. | |
| 7,305,535 B2 | 12/2007 | Harari et al. | |
| 7,364,090 B2 | 4/2008 | Cuellar | |
| 7,400,165 B2 | 7/2008 | Park | |
| 2004/0064612 A1 | 4/2004 | Pinto et al. | |
| 2004/0215996 A1 | 10/2004 | Kanamori et al. | |
| 2009/0316847 A1 | 12/2009 | Thomsen | |

FOREIGN PATENT DOCUMENTS

JP     2001211070 A *   8/2001
WO     WO 2009/006841     1/2009

OTHER PUBLICATIONS

Notification of Transmittal of the International Search Report and the Written Opinion of the International Searching Authority, or the Declaration for International Application No. PCT/US2011/030556 mailed Jun. 15, 2011, 11 pages.

\* cited by examiner

*Primary Examiner* — Ryan Johnson
(74) *Attorney, Agent, or Firm* — Davis Wright Tremaine LLP (57) ABSTRACT

A technique and corresponding circuitry are presented for a process independent, self-calibrating relaxation based clock source. The technique and circuitry presented here can reduce the time and cost needed for calibration significantly. The relaxation based clock source produces a clock signal whose frequency is dependent upon a trim value. Starting from an initial trim value, the clock signal is generated, its frequency is compared with a reference clock frequency value, and the trim value is correspondingly adjusted up or down a bit at a time. After this process has continued for a while, min-max logic is used to determine the maximum and minimum trim values and, based on these, the final trim value for the clock is set. This calibration process can also be used to extract whether, and by how much, the implementation on silicon of a particular chip lies in the fast or slow process corners.

12 Claims, 5 Drawing Sheets

SELF-CALIBRATING RELAXATION OSCILLATOR BASED CLOCK SOURCE

FIELD OF THE INVENTION

This invention pertains generally to the field of clock sources for integrated circuits and, more particularly, to relaxation oscillator based clock sources and their calibration.

BACKGROUND

System on Chip (SoC) Circuits often have embedded clock sources, frequently a phases locked loop (PLL) that generates the clock signal. Although these PLL circuits are the standard way of providing an accurate clock signal, they have some drawbacks, particularly for applications, such as small form factor memory cards like the MicroSD cards, for example. One of these drawbacks is that such devices have very small size boards, so that it becomes difficult to find space for an external crystal oscillator, which is needed as reference clock for PLLs. Another is that if the use of a crystal could be eliminated, the cost saving can be significant for a high volume product. The relaxation oscillator is widely used clock source as an alternative to PLLs. The relaxation oscillator does not need external reference clock, but suffers from large output frequency variation mainly due to process dependence and so requires calibration. This calibration time could be long due to manual intervention and needs costly equipment like high bandwidth oscilloscopes.

SUMMARY OF THE INVENTION

According to a general aspect of the invention, a circuit has a clock generation unit, including a relaxation oscillator that generates a calibratable output clock signal having a frequency dependent upon a trim value. The circuit also includes a frequency comparison circuit and a trim value adjustment circuit. The frequency comparison circuit is connected to receive a reference clock signal and feedback clock signal derived from the calibratable clock signal, and provides an indication of whether the feedback clock signal has a frequency that is higher or lower than the reference frequency. (Here, this external reference clock is needed only during calibration process.) The trim value adjustment circuit includes: an up-down counter connected to receive the indication and, starting from an initial or default trim value, adjust the trim value higher or lower in response to the indication; and min-max logic that, in response to an enable signal being asserted, the minimum and maximum of the trim value are determined and, in response to the enable signal being de-asserted, the trim value is set to a value derived from the minimum and maximum of the trim value.

Other aspects include a method of calibrating the frequency of a clock circuit generating an output clock signal from a relaxation oscillator. The method includes receiving an initial trim value and iteratively performing a process that includes: generating a clock signal by the relaxation oscillator having a frequency dependent upon the trim value; performing a comparison of the frequency of the output clock signal with a reference clock; and adjusting the trim value based upon the comparison. Subsequent to performing this process over multiple iterations, the method determines, over the course, the maximum and the minimum of the trim value and sets the final trim value based upon the maximum and the minimum.

Various aspects, advantages, features and embodiments of the present invention are included in the following description of exemplary examples thereof, whose description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

The following provides a technique and corresponding circuitry for a process independent, self-calibrating relaxation oscillator based clock source. Relative to the use of a phase locked loop (PLL), the use of a relaxation oscillator based clock source has the advantages of requiring little space and of lower cost. Although relaxation oscillators have been previously used for various applications, because of process variations they have tended to be relatively inaccurate and require a relatively long time to calibrate accurately. For example, under a typical prior art arrangement, the calibration time needed to accommodate the process variation of the relaxation oscillator can be on the order of a second or two and require costly external components, such as a high bandwidth oscilloscope, for calibration. The techniques and circuitry presented here can reduce the time needed for calibration significantly, to on the order of a few hundred micro seconds in the exemplary embodiments, and does not require external components. As this method can considerably reduce the test-time, associated test cost and, hence, the cost of the final product is reduced.

Consequently, although more widely applicable, the techniques and circuitry presented here are particularly advantageous to applications for small size devices, products produced in large numbers, or both. An example of this are non-volatile memory cards, particularly those of small form factor, such as microSD, SD, memory stick, or compact flash cards for example, that need an accurate clock source for their controllers. More detail on non-volatile memory cards and related devices can be found in the following U.S. Pat. Nos. 5,887,145; 6,040,622; 6,279,114; 6,820,148; 6,901,457; 7,090,124; 7,305,535; and 7,364,090; the following US patent publications: 2004/0064612; 2004/0215996; and the international patent application WO IB2009/006841 filed on Sep. 15, 2009.

Figure 1:
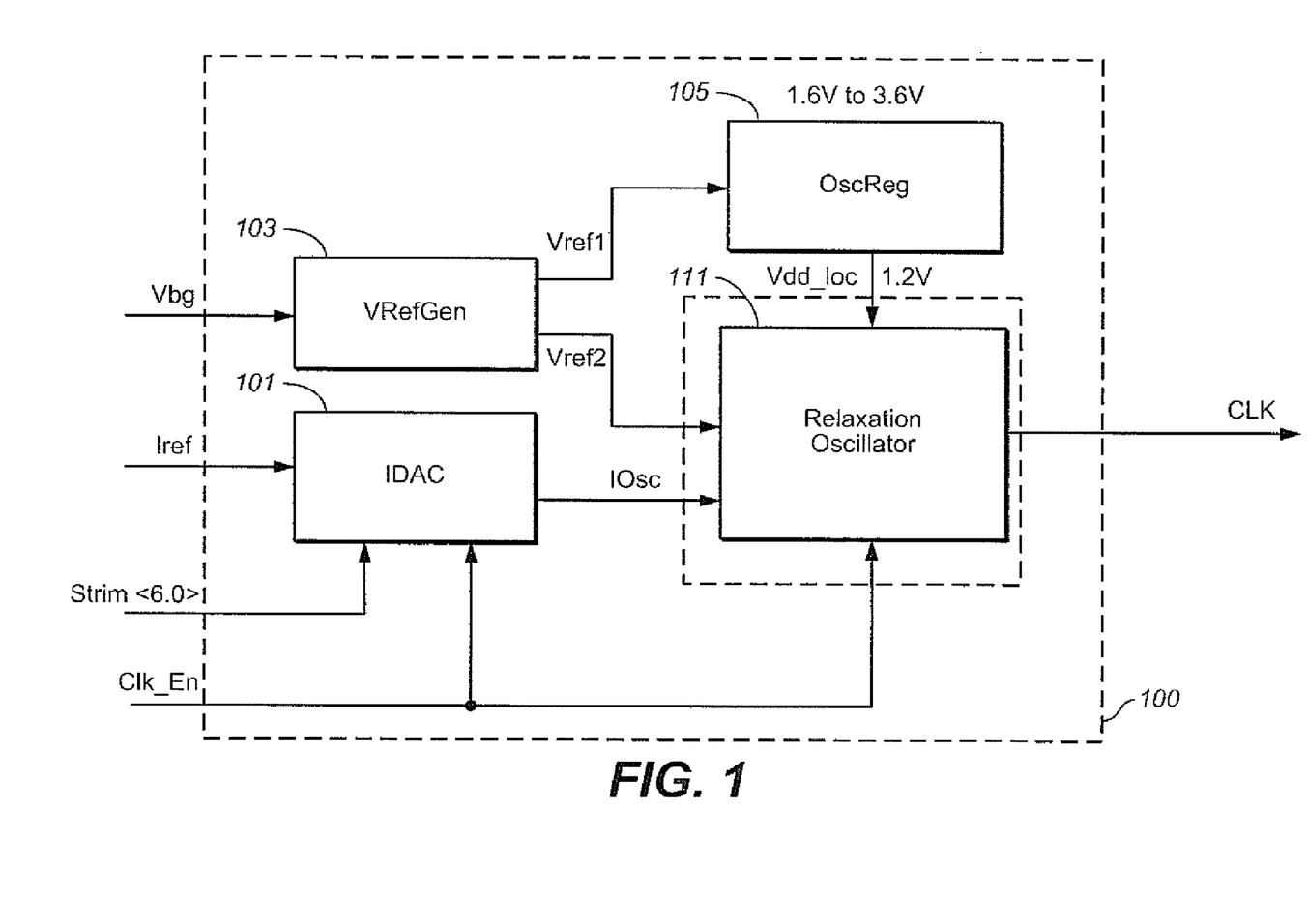
FIG. 1 is a block diagram of an exemplary embodiment of a relaxation based clock source.

FIG. 1 is block diagram of an example of a relaxation oscillator based clock source 100 that does not need an external reference clock. By setting the input trim value (Strim), a desired frequency of the output clock signal (CLK) can be quickly (in hundreds of nS) and accurately set. In this example, the trim value Strim<6:0> is a 7-bit value feed into IDAC 101. The current source IDAC 101 also receives and multiplies a reference current Iref according to the trim bits Strim<6:0> and provides a charging current IOsc for oscillator 111. The trim signal determines the value of IOsc, which in turn determines the frequency of the clock signal CLK, allowing the clock frequency to be accurately set over a range of frequencies, say from 100 MHz to 250 MHz, allowing the same circuit to be applied to a number of applications, The clock circuit 100 also receives an enable signal Clk_En for the oscillator 111 that is also supplied to IDAC 101. A local voltage reference generation circuit VRefGen 103 receive an accurate reference input Vbg, such as provided by a band gap device, and provides the reference voltages for the local regulator 105 (VRef1) and for the oscillator 111 (VRef2). The local voltage regulator OscReg 105 provides a 1.2 volt, for example, local supply (Vdd_loc) for the oscillator 111 to reduce frequency variation over input supply voltage variation (1.6V to 3.6V in this example), providing supply voltage variation immunity. (More detail on, and example of, voltage regulation circuitry that be applied here is presented in U.S. patent application Ser. No. 12/632,998, filed on Dec. 8, 2009, and U.S. patent application Ser. No. 12/693,228 filed on Jan. 25, 2010.) Although the embodiment of FIG. 1 can be taken as the exemplary embodiment of a clock circuit for the present discussion, other relaxation oscillator based clock circuits can be used as well.

Figure 2:
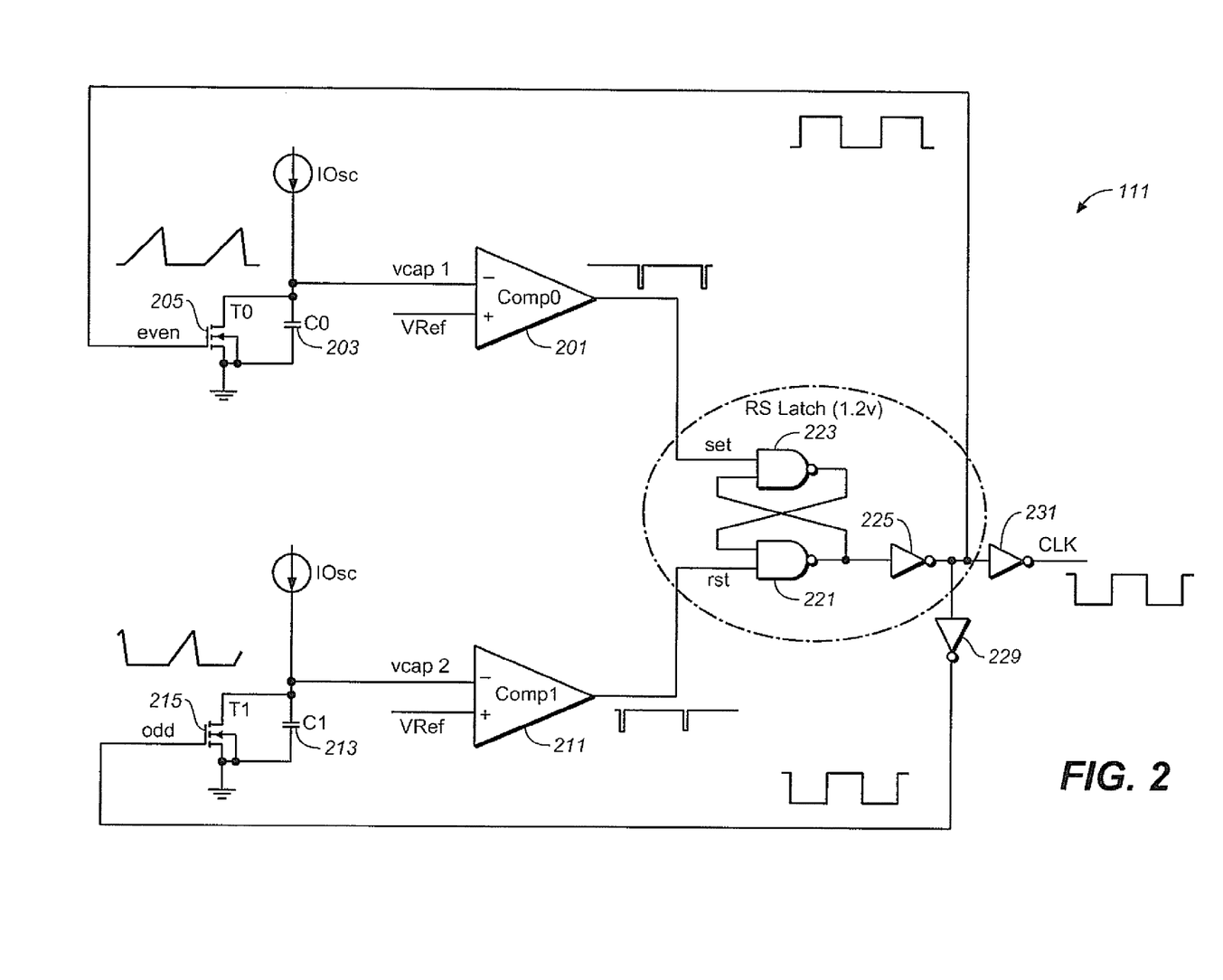
FIG. 2 is a block diagram of an exemplary embodiment for a relaxation oscillator.

FIG. 2 is a block diagram of an exemplary embodiment for the relaxation oscillator 111, although, as with FIG. 1, other embodiments can be used. In such relaxation oscillators the output clock CLK is generated by charging and discharging of the two capacitors C0 203 and C1 213, with two comparators Comp 0 201 and Comp 1 211 and a SR latch, formed of cross-coupled NAND gates 221 and 223 and inverter 225. A constant current source IOsc, from IDAC 101, charges the capacitor C0 203. When the voltage vcap1 across the capacitor C0 203 reaches to a reference level Vref2 from VRefGen 103, the comparator Comp0 201 sets the RS latch but the signal set to the input of the NAND gate 223, as shown by the waveform at the output of Comp0 201. The output of the latch (after inversion by 231) is the clock signal CLK with the waveform as shown. The signal CLK then travels (through the inverter 229, where the waveform at the output is shown) is applied to the gate of transistor T1 215 to initiate a charging operation for the other capacitor C1 213. The output of the latch (the inverted CLK signal) is also applied to the gate of transistor T0 205 and discharges the capacitor C0 203. When the voltage vcap2 across the second capacitor C1 213, whose waveform is shown, reaches to the reference level, the comparator Cow1 211 resets the RS Latch. In this way, the output of the latch initiates the charging operation for the capacitor C0 203 and discharges the capacitor C1 213. This results in the continuous clock signal CLK being generated at the output of the latch. The fundamental oscillation frequency fCLK is then given by fCLK=IOsc/2CVRef2, where C is the capacitance of C0 and C1. The clock frequency consequently depends on the charging current IOsc and the capacitor value C of C1 203 and C2 213. By controlling the charging current, which is set based on the trim value Strim<6:0>, the frequency of the oscillator is trimmed.

Figure 3:
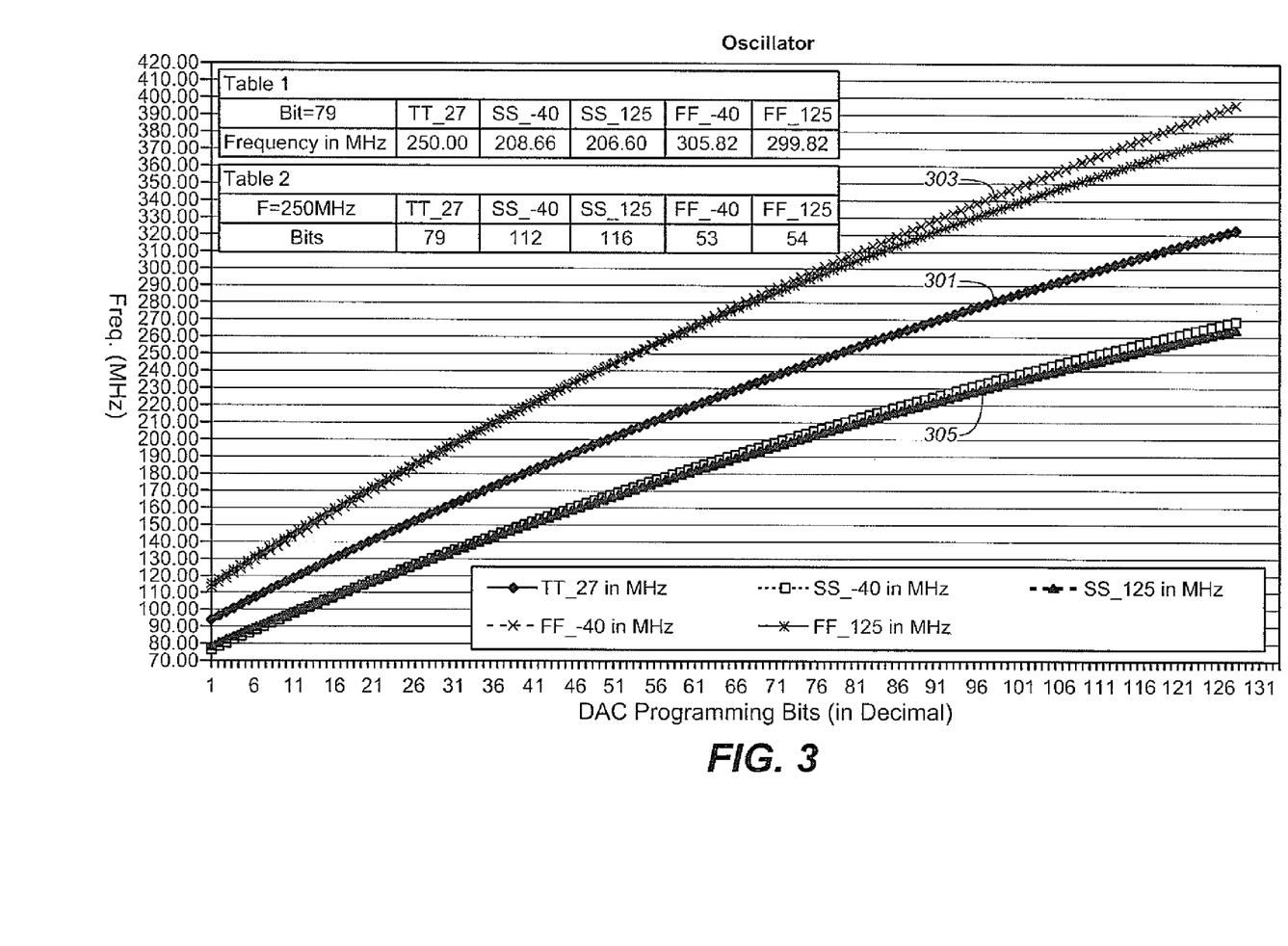
FIG. 3 illustrates frequency variation with process corners and DAC control bits in relaxation oscillator.

For a design using such architecture, the output clock frequency variation due to process dependence can be quite large. FIG. 3 illustrates this frequency variation with process corners and DAC control bits of the relaxation oscillator. The vertical axis is the clock frequency and the horizontal axis is the 7-bit input value for Strim<6:0>, with the actual behavior for an oscillator shown. The behavior of an oscillator for the nominal process values (a typical process corner, TT_27) is shown by the line 301. As the DAC programming bit varies over the 7-bit input value, the frequency ranges from around 90 MHz to around 320 MHz. The line 303 shows the frequency versus programming bits behavior for a pair of fast process corners (FF_−40, FF_125), and line 305 shows the frequency versus programming bits behavior for a pair of slow process corners (SS_−40, SS_125).

For a desired frequency of 250 MHz, the Strim value for the nominal device is 79. This is shown in Table 1 on FIG. 3, where the frequency Corresponding to bit 79 is shown for the illustrated process corners. For the slow corners, this is over 40 MHz less than the desired 250 MHz. For the fast corners, the frequency can be over 50 MHz too high. Conversely, Table 2 shows the bit value needed to provide the desired 250 MHz across the shown process variations. It is this Strim value that needs to be calibrated. To accommodate this frequency variation the current Iose used to charge and discharge the relaxation oscillator's capacitors C0 203 and C1 213 shown in FIG. 2 is generated using IDAC 101 shown in FIG. 1.

To calibrate each such relaxation oscillator, one technique would be to use binary search method. In this method, the number of iterations to reach to the right frequency is equal to number of programmable bits Strim in the DAC. For example, in exemplary design is of 7 bits, it would need seven iterations to get the right output frequency. If it is needed to do the multi-die (site) calibrations, this takes a very large time to measure the output frequency of all the sites and then program the different sites with the corresponding different DAC bits depending upon their respective process corner. To automate the process of this calibration, the circuit of FIG. 4, with the transient response of this circuit is shown in FIG. 5.

Figure 4:
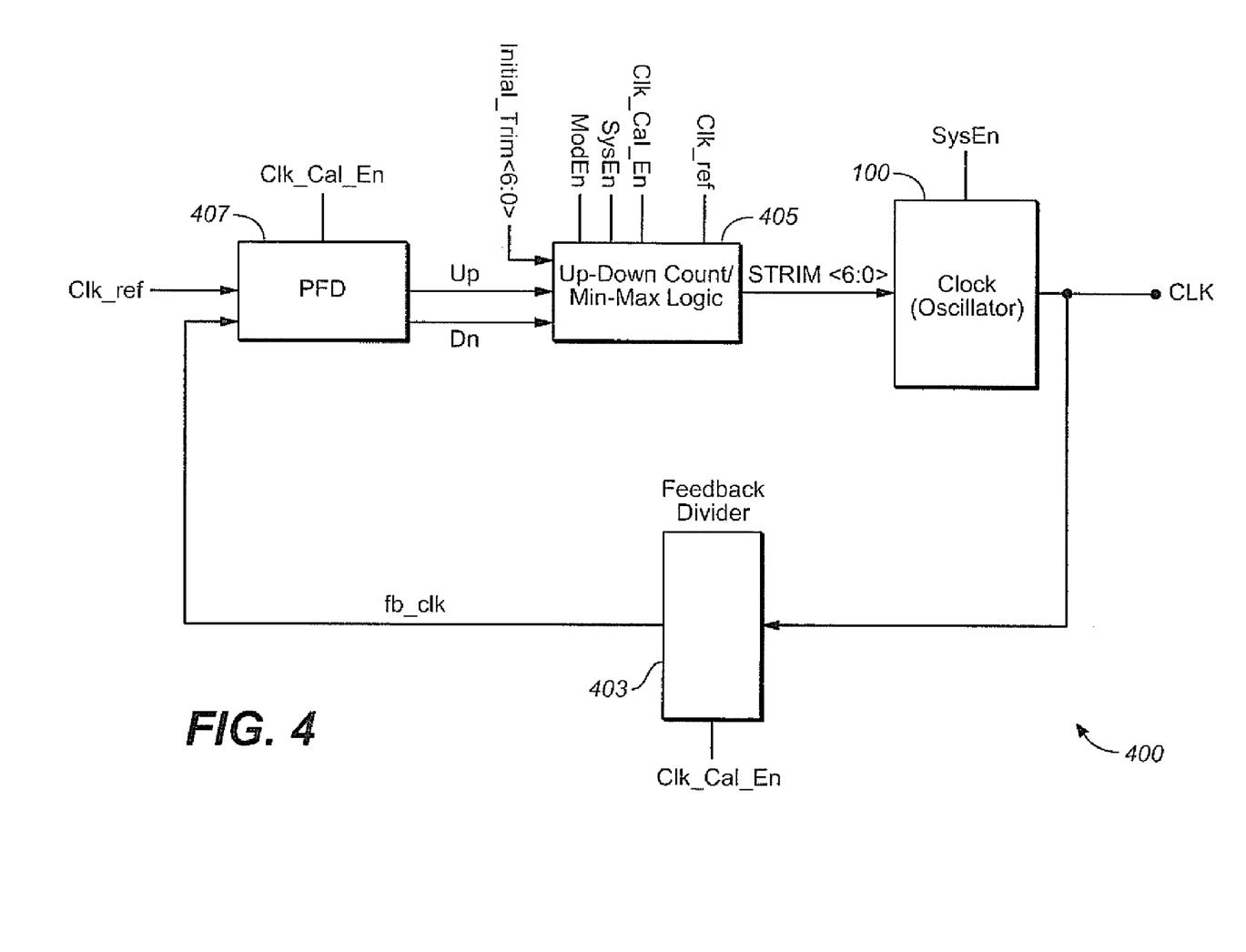
FIG. 4 illustrates an exemplary embodiment of a relaxation oscillator calibration mechanism with phase-frequency detector (PFD), frequency divider and min-max logic.
Figure 5:
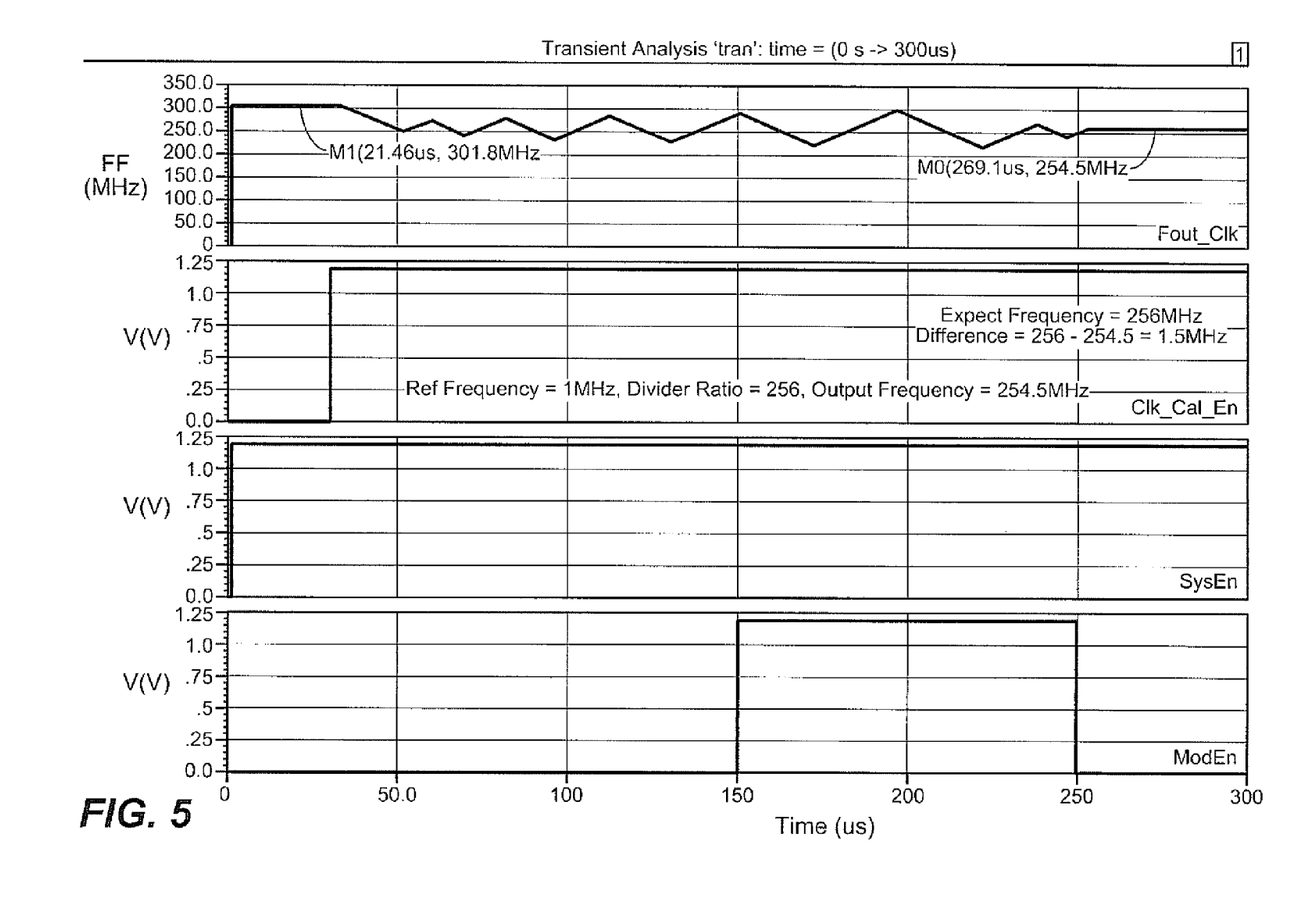
FIG. 5 illustrates transient response of the PFD and min-max logic with relaxation oscillator.

FIG. 4 is a block diagram of an exemplary embodiment of a relaxation oscillator calibration circuit 400 incorporating a phase-frequency detector (PFD) and min-max logic. (The PFD and min-max logic can standard implementations, or other only-frequency detector blocks can be used in place of a PFD.) The relaxation oscillation clock source Oscillator 100 can be that such as described above with respect FIGS. 1 and 2. The inputs are the system enable signal SysEn, corresponding to the clock enable signal Clk_En of FIG. 1, and the trim value Strim<6:0>. (Although the exemplary embodiment uses a 7-bit trim value, other values can be used depending upon the need range, accuracy, or both required.) In FIG. 4, the other inputs not relevant to the discussion here, such as the reference voltage Vbg and reference current Iref in FIG. 1, are suppressed to simplify the discussion. Based on the value of Strim, the Oscillator 100 then generates the clock signal CLK as previously described.

The other elements of FIG. 4 are used to calibrate the value of Strim<6:0>. The value of Strim is determined in the up-down counter/min-max logic 405. The circuit 405 receives an initial/default trim value (Initial_Trim<6:0>) and, based on the UP and DN inputs, raises or lowers the trim value. The circuit 405 also receives a reference clock (Clk_ref), the system enable signal (SysEn), a clock calibration enable signal (Clk_Cal_En), and a module enable signal (ModEn). These various signal are used to adjust the trim value during calibration as described below. The trim adjust values UP and DN, which are used to alter the trim value a bit at a time, are supplied from the frequency phase detector PFD 407, whose inputs are the reference clock value (Clk_ref) and calibration enable signal (Clk_Cal_En), as well as the feed-back clock signal from Clk. The PFD 407 is used to compare the value CLK against a reference value, but as the desired frequency of Clk may differ from the reference value (Clk_ref), a feedback divider circuit 403 can be included to receive the clock signal Clk from Oscillator 100 and, when enabled by (Clk_Cal_En), provides the suitably clock frequency fb_clk to PFD 407.

The calibration process can be performed before shipping of the device, at test time for example, beginning with the default control bits Initial_Trim<6:0> corresponding to the nominal process corner TT_27 are transferred to the corresponding node and the oscillator in the clock block 100 generates the output frequency which depends upon the manufactured silicon corner and could be higher or lower than the desired nominal value. When the control signal Clk_Cal_En is enabled (made high), the phase-frequency detector (PFD) 407 starts comparing the tester reference clock Clk_ref (a JTAG test clock, for example) with the divided output clock fb_clk. If this divided output clock is higher than the tester reference clock, a down DN pulse gets generated and the control bits of the DAC is reduced by one bit (LSB). Hence the output frequency of the clocks block reduces. This process continues until the divided output clock is very close to the tester reference clock, and clocks block output frequency is very close to the desired frequency. The similar process for the UP signal for pushing the output clock to the higher side when the divided clock fb_clk is lower than the tester reference clock.

As this loop is not a complete phase locked loop (PLL) and the output frequency of the clock block 100 is only function of the control bits Strim<6:0>, without any phase co-relation to the tester reference clock, after certain time (when output frequency come in right range) the output frequency may start varying in a triangular fashion, as the Clk value goes between overshooting and undershooting the desired value as the circuit iterates through cycle of generating the clock signal, comparing the frequency, and adjusting the trim value. The range of this triangular frequency variation depends upon the sensitivity of the PFD and is due to a few other factors.

A first factor is that the exemplary embodiment of FIG. 4 is using a phase-frequency detector PFD 407, which tries to change the trim bit or control bits of Strm such that output frequency comes close to desired value. Once the output frequency is in vicinity of the desired output frequency, then the PFD 407 start adjusting the phase of the two input frequencies, means it tries to increase/decrease the frequency such that the phases are also aligned. To align these phases the outputs UP and DN of PFD 407 will keep giving high or low pulses as it tries to increase and decrease frequency as phases are not aligned. Due to this alignment of phase issue the output frequency will tend to overcorrect.

Another factor is that, as can be seen in FIGS. 1 and 2, the only control the loop of FIG. 4 has on the block 100 is through the Strm<6:0> settings. As the output frequency Clk of the relaxation oscillator bock 111 does not has any phase co-relation with input reference frequency, when a bit in Strm changes the frequency increases in increments of say, ~2 MHz without any co-relation of phase. (The ~2 MHz is based on the exemplary design values as shown in FIG. 3, but can vary with the process corner and temperature.). If the desired frequency is, say, 250 MHz, then this system will not exactly zero-in on the 250 MHz, but will over/under shoot this value. As the Clk value will be slightly off due to the resolution of the trim bit, rather than converge to 250 MHz, the frequency will oscillate between two successive values, such as 249 MHz and 251 MHz.

Although the amount of overshoot can be reduced by, say, increasing the PFD's frequency detection sensitivity and decreasing its phase sensitivity, there will still be some degree of overcorrection that should preferably be dealt with. In the exemplary embodiment, this done through a min-max method by including min-max logic along with the up-down counter circuitry of block 405. The use of this will be explained with reference to FIG. 5.

In FIG. 5, the system is to be calibrated to a frequency of 256 MHz, which, with a frequency divider ratio of 256, allows it to be compared to a reference frequency of 1 MHz. For the clock circuitry to begin operating so that it can be calibrated, the system enable signal (SysEn) is taken high, as shown in the third trace in FIG. 5, and the oscillator provides a clock signal whose frequency is determined by the Initial_Trim value. In this case, this corresponds to about 301 MHz, as shown in the top trace of FIG. 5. To start the actual calibration process, the clock calibration enable signal Clk_Cal_En goes high, as shown in the second trace of FIG. 5 and, as the clock frequency is above the expected frequency, the trim value begins to count down and the clock frequency (top trace) is correspondingly lowered toward the desired frequency. As described, however, the system will overshoot (or, rather, undershoot) the expected frequency by some distance before it reverses itself, begins to increase and overshoot on the high side. This over correction continues on, leading to the triangular waveform described above.

Once output frequency is in the definite range and varies in this triangular fashion, the "ModEn" signal (bottom trace in FIG. 5) is enabled (made "HIGH"). Once this signal is enabled, the Min-Max logic of block 405 finds the DAC controls bits corresponding to the maximum and minimum frequencies in the triangular frequency variation and, when this "ModEn" signal subsequently goes "Low" this logic locks the average controls bits at the "STrim<6:0>" node, which corresponds to the desired frequency output of the clock's block. These bits can be read by the tester and programmed for the particular die or could be stored in memory of the chip or could be written on E-fuse. With respect to when to start and end the min-max process, that is, when to enable and disable ModEn, the process should not start until the calibration has gone on long enough to establish the triangular behavior and continue long enough for at least one minimum and maximum. Generally, however, as this method is significantly faster than the prior art techniques, it is possible to wait the equivalent of several minimum and maximum peaks before taking ModEn high and then allow it to stay high for several cycles. The values can be set by considering several typical devices and then allowing relatively generous timing margins, with the enable, disable points for ModEn can be set based on time or the number of iterations of adjusting the trim value. With this mechanism, an exemplary device (corresponding to the values of FIG. 3) can complete the full calibration cycle in ~300 microseconds, which is significantly lower than the ~1.7 second calibration time using the typical prior art arrangement. Also, there is no need of any costly output frequency measurement system.

Concerning the various control signals, the Clk_Cal_En signal can be generated after a certain amount of delay from the SysEn; and this delay between SysEn and Clk_Cal_En should be more than the settling time of oscillator. The Clk_Cal_En signal can also be independently controlled by firmware, controlling the test function or calibration process. In the exemplary embodiment, the typical settling time of the oscillator is ~500 nS. Similarly the "ModEn" signal is being generated internally after certain delay from the Clk_Cal_En and this delay time can be pre-defined during design phase.

As discussed above with respect to FIG. 3, the circuit will generally be a part of larger circuit on a chip that is formed as part of a wafer that is expected to be manufactured according to the typical process corner. The typical process corner is where the various devices on the chip are manufactured to have the typical, or nominal, value prescribed for the device and corresponds to the "TT_27" device of line 301 in FIG. 3. Due to process variations, in practice the wafers may be in the slow (SS) or fast (FF) process corners; it is also not unusual for that a wafer or a particular silicon chip is not completely in a particular, say FF, corner but only partially so. It is these process variations for which the above described techniques determine and compensate. Before leaving the subject, these variations are considered further.

For example, referring to Table 1 on FIG. 3, in the FF corner the output frequency is ~300 MHz for initial Strim bit setting of 79, where as the desired frequency in this example is 250 MHz. It is also possible that a similar clock circuit formed elsewhere on the same wafer is also in a less fast, but faster than typical corner that provides a frequency of, say, 270 MHz or some other number in between 250 MHz to ~300 MHz. (Similar variations can also occur for slow (SS) corner devices.) During the calibration process as described above, for a fast corner the control bits of Strim will step down and will eventually be set to provide the desired frequency of 250 MHz. By subsequently measuring the difference between the initial trim bits and final trim bit, a couple of important pieces of information can be determined: first, whether the chip is in a fast (FF) corner or a slow (SS) corner by looking at the sign difference (initial Strim bits–final Strim bits). This difference will be positive for a chip in FF corner, while negative if a chip is in SS corner. A second, important, piece of information that be concluded is how much fast (FF) or how slow (SS) the chip is: For example, for a 250 MHz clock frequency, by referring to Table 2 of FIG. 3, it can be seen that if the Strim value is moved from bit 79 to 54, then the chip was in a complete FF corner; but if the calibration only changes the Strim value from the initial 79 to 67, then chip was only ~50% fast with respect to the "full" TT corner. This additional piece of information can be extracted from this calibration process. This additional information, which is a byproduct of the relaxation oscillator calibration process, can then be used to fine tune different parts of the chip, such as reference voltages, currents or other important process-dependent device parameters.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A circuit, comprising:
 a clock generation circuit, including a relaxation oscillator that generates a calibratable output clock signal having a frequency dependent upon a trim value;
 a frequency comparison circuit connected to receive a reference clock signal and feedback clock signal derived from the calibratable clock signal and provide an indication of whether the feedback clock signal has a frequency that is higher or lower than the reference frequency; and
 a trim value adjustment circuit, including:
  an up-down counter connected to receive the indication and, starting from an initial/default trim value, adjust the trim value higher or lower in response thereto; and
  min-max logic, wherein, in response to an enable signal being asserted, the minimum and maximum of the trim values are determined and, in response to the enable signal being de-asserted, the trim value is set to a value derived from the minimum and maximum of the trim values.

2. The circuit of claim 1, wherein the clock generation circuit further includes:
 a current source connected to receive the trim value, generate a current value dependent upon the trim value, and supply the current value to the relaxation oscillator.

3. The circuit of claim 2, where the clock generation circuit further includes:
 a voltage regulation circuit connected to provide a voltage supply to the relaxation oscillator; and
 a reference generation circuit connected to supply reference voltages to the voltage regulation circuit and the relaxation oscillator circuit.

4. The circuit of claim 2, where the relaxation oscillator includes a first capacitor and a second capacitor, each connected to receive the current from the current source.

5. The circuit of claim 1, further comprising:
 a frequency divider connected to receive the calibratable output clock signal and generate therefrom the divided feedback clock signal.

6. The circuit of claim 1, wherein a reference clock is externally supplied.

7. A method of calibrating the frequency of a clock circuit generating a clock signal from a relaxation oscillator, comprising:
 receiving an initial trim value;
 iteratively performing a process including:
  generating a clock signal by the relaxation oscillator having a frequency dependent upon the trim value;
  performing a comparison of the frequency of the clock signal with a reference clock frequency value; and
  adjusting the trim value based upon the comparison;
 subsequent to performing the process over multiple iterations, determining over the course thereof the maximum and the minimum of the trim value; and
 setting the final trim value based upon the maximum and the minimum trim values.

8. The method of claim 7, further comprising:
 receiving the trim value at a current source; and
 generating in the current source a current value dependent upon the trim value; and
 supplying the current value to the relaxation oscillator.

9. The method of claim 8, further comprising:
 providing a voltage supply to the relaxation oscillator from a voltage regulation circuit; and
 supplying reference voltages from a reference generation circuit to the voltage regulation circuit and the relaxation oscillator circuit.

10. The method of claim 8, wherein the relaxation oscillator includes a first capacitor and a second capacitor, the method further comprising:
 receiving the current from the current source at the first and second capacitors.

11. The method of claim 7, further comprising:
 receiving the clock signal at a frequency divider; and
 generating from the clock signal a divided feedback clock signal on the frequency divider, wherein said comparison of the frequency of the clock signal with a reference clock frequency value compares the divided feedback clock signal with the reference clock frequency.

12. The method of claim 7, wherein the reference clock is externally supplied.

* * * * *

UNITED STATES PATENT AND TRADEMARK OFFICE
CERTIFICATE OF CORRECTION

| | | |
|---|---|---|
| PATENT NO. | : 8,085,099 B2 | Page 1 of 1 |
| APPLICATION NO. | : 12/754836 | |
| DATED | : December 27, 2011 | |
| INVENTOR(S) | : Pancholi et al. | |

It is certified that error appears in the above-identified patent and that said Letters Patent is hereby corrected as shown below:

Column 8, line 26; delete "the frequency" and insert -- a frequency --.

Signed and Sealed this
Thirteenth Day of March, 2012

David J. Kappos
*Director of the United States Patent and Trademark Office*